(12) United States Patent
Wu et al.

(10) Patent No.: US 11,538,426 B2
(45) Date of Patent: *Dec. 27, 2022

(54) DISPLAY PANEL AND ELECTRONIC APPARATUS

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Xinwei Wu, Beijing (CN); Zhen Zhang, Beijing (CN); Wei Zhang, Beijing (CN); Cunzhi Li, Beijing (CN); Jonguk Kwak, Beijing (CN); Yanyan Xu, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/452,149

(22) Filed: Oct. 25, 2021

(65) Prior Publication Data

US 2022/0051636 A1 Feb. 17, 2022

Related U.S. Application Data

(63) Continuation of application No. 16/858,337, filed on Apr. 24, 2020, now Pat. No. 11,176,898.

(30) Foreign Application Priority Data

Sep. 19, 2019 (CN) .......................... 201910888179.1

(51) Int. Cl.
*G09G 3/36* (2006.01)
*G09G 3/3266* (2016.01)

(52) U.S. Cl.
CPC ......... *G09G 3/3607* (2013.01); *G09G 3/3266* (2013.01); *G09G 2320/0242* (2013.01); *G09G 2320/0666* (2013.01)

(58) Field of Classification Search
CPC .............. G09G 3/3607; G09G 3/3266; G09G 2320/0242; G09G 2320/0666
See application file for complete search history.

(56) References Cited

U.S. PATENT DOCUMENTS 10,042,495 B2 8/2018 Yang et al.
10,198,115 B2 2/2019 Yang et al.
(Continued)

FOREIGN PATENT DOCUMENTS

CN 104850268 A 8/2015
CN 105094491 A 11/2015

OTHER PUBLICATIONS

Non-Final Office Action dated Mar. 29, 2021, received for U.S. Appl. No. 16/858,337.
(Continued)

*Primary Examiner* — Kenneth B Lee, Jr.
(74) *Attorney, Agent, or Firm* — Kinney & Lange, P.A.

(57) ABSTRACT

A display panel includes a display area and a first peripheral area located around the display area. A first gate driver is provided in the first peripheral area. The display panel is further provided with a plurality of first driving signal lines and a plurality of second driving signal lines. The plurality of first driving signal lines are arranged in a different layer from a layer in which the plurality of second driving signal lines are located. The m-th first driving signal line of the plurality of first driving signal lines and the k-th second
(Continued)

driving signal line of the plurality of second driving signal lines are both electrically connected, in the first peripheral area, to an m-th output terminal of the first gate driver, where m is an integer greater than or equal to 1 and k is also an integer greater than or equal to 1.

16 Claims, 4 Drawing Sheets

(56) References Cited

U.S. PATENT DOCUMENTS

| | | |
|---|---|---|
| 10,235,938 B2 | 3/2019 | Takahara et al. |
| 11,176,898 B2 * | 11/2021 | Wu .................... G09G 3/3266 |
| 2008/0246403 A1 | 10/2008 | Sagawa et al. |
| 2015/0379938 A1 | 12/2015 | Choi et al. |
| 2016/0171933 A1 | 6/2016 | Takahara et al. |
| 2018/0204895 A1 | 7/2018 | Lin et al. |

OTHER PUBLICATIONS

Notice of Allowance and Fee(s) Due dated Jul. 13, 2021, received for U.S. Appl. No. 16/858,337.

First Chinese Office Action dated Jul. 4, 2022, for corresponding Chinese Application No. 201910888179.1.

Yoo, J.S. et al., Technological Considerations for Manufacturing Flexible Active-Matrix OLED Displays, vol. 24. pp. 26-30. (2008).

* cited by examiner

DISPLAY PANEL AND ELECTRONIC APPARATUS

CROSS-REFERENCE TO RELATED APPLICATION(S)

This application is a continuation of U.S. application Ser. No. 16/858,337, filed Apr. 24, 2020, for "Display Panel and Electronic Apparatus", which claims the benefit of Chinese Patent Application No. 201910888179.1 filed on Sep. 19, 2019 with the China National Intellectual Property Administration, the disclosures of which are incorporated in their entireties herein by reference.

TECHNICAL FIELD

The present disclosure relates to the field of display technologies, and in particular, to a display panel and an electronic apparatus.

BACKGROUND

In the display panel, GOA (Gate driver On Array) is generally arranged in the peripheral area around the display area and electrically connected to each of the pixel driving circuits in the display area to control operating states of the switching device in the pixel driving circuit.

SUMMARY

An embodiment of the present disclosure provides a display panel, including: a display area; and a first peripheral area located around the display area, a first gate driver being provided in the first peripheral area; wherein the display panel is further provided with a plurality of first driving signal lines and a plurality of second driving signal lines; the plurality of first driving signal lines are arranged in a different layer from a layer in which the plurality of second driving signal lines are located; and the m-th first driving signal line of the plurality of first driving signal lines and the k-th second driving signal line of the plurality of second driving signal lines are both electrically connected, in the first peripheral area, to an m-th output terminal of the first gate driver, where m is an integer greater than or equal to 1 and k is also an integer greater than or equal to 1.

In some embodiments, the display panel further includes a second peripheral area located around the display area; the first peripheral area and the second peripheral area are located at two opposite sides of the display area, respectively; and a second gate driver is provided in the second peripheral area; and the m-th first driving signal line of the plurality of first driving signal lines and the k-th second driving signal line of the plurality of second driving signal lines are both electrically connected, in the second peripheral area, to an m-th output terminal of the second gate driver.

In some embodiments, the first driving signal line is a gate line, and the second driving signal line is an auxiliary line electrically connected in parallel with the gate line.

In some embodiments, a plurality of rows of sub-pixel units are provided in the display area; the gate lines and gate electrodes of transistors in the sub-pixel units are arranged in the same layer; and the auxiliary lines and anodes in the sub-pixel units are arranged in the same layer.

In some embodiments, the auxiliary line has a fold-line shape.

In some embodiments, the display panel further includes a base substrate; and an orthographic projection of the auxiliary lines on the base substrate is not overlapped with an orthographic projection of the anodes of the sub-pixel units on the base substrate.

In some embodiments, the m-th gate line is electrically connected to the gate electrodes of the transistors in the m-th row of sub-pixel units.

In some embodiments, the display panel further includes a base substrate, and the k-th auxiliary line is located on a side of the first gate driver and the second gate driver distal to the base substrate; a planarization layer is provided on the side of the first gate driver and the second gate driver distal to the base substrate; and the k-th auxiliary line is electrically connected to the m-th output terminal of the first gate driver through a first via hole that penetrates through the planarization layer.

In some embodiments, the k-th auxiliary line is electrically connected to the m-th output terminal of the second gate driver through a second via hole that penetrates through the planarization layer.

In some embodiments, each of the first peripheral area and the second peripheral area further includes: a pixel definition layer on a side of the auxiliary lines distal to the base substrate; an electron transport layer on a side of the pixel definition layer distal to the base substrate; a cathode layer on a side of the electron transport layer distal to the base substrate; a first passivation layer on a side of the cathode layer distal to the base substrate; an encapsulation layer on a side of the first passivation layer distal to the base substrate; and a second passivation layer on a side of the encapsulation layer distal to the base substrate.

In some embodiments, the first peripheral area further includes: a first level signal line on a side of the planarization layer that faces towards the base substrate, the first level signal line being further away from the display area than the first gate driver; and a cathode connection layer on a side of the planarization layer distal to the base substrate, wherein the cathode connection layer is electrically connected to the cathode layer and electrically connected to the first level signal line by a third via hole penetrating through the planarization layer; and the cathode connection layer and the auxiliary lines are arranged in the same layer.

In some embodiments, the second peripheral area further includes: a first level signal line on a side of the planarization layer that faces towards the base substrate, the first level signal line being further away from the display area than the second gate driver; and a cathode connection layer on a side of the planarization layer distal to the base substrate, wherein the cathode connection layer is electrically connected to the cathode layer and electrically connected to the first level signal line by a third via hole penetrating the planarization layer; and the cathode connection layer and the auxiliary lines are arranged in the same layer.

In some embodiments, a plurality of reset lines are further provided in the display area; and an n-th output terminal of the first gate driver and an n-th output terminal of the second gate driver are both electrically connected to the (n−1)-th reset line, where n is an integer greater than or equal to 2.

In some embodiments, each of the first peripheral area and the second peripheral area further includes: a first wall and a second wall which is farther from the display area than the first wall, wherein the first wall includes a first blocking layer on a side of the cathode connection layer distal to the base substrate and a second blocking layer on a side of the first blocking layer distal to the base substrate; the second wall includes a third blocking layer on a side of the first level signal line distal to the base substrate, a fourth blocking layer on a side of the cathode connection layer distal to the base substrate, and a fifth blocking layer on a side of the fourth blocking layer distal to the base substrate; the first blocking layer and the fourth blocking layer are arranged in the same layer and made of the same material as the pixel definition layer; and the third blocking layer is arranged in the same layer and made of the same material as the planarization layer.

An embodiment of the present disclosure provides an electronic apparatus including the display panel as described in any one of the above embodiments.

In some embodiments, the display panel further includes a second peripheral area located around the display area; the first peripheral area and the second peripheral area are located at two opposite sides of the display area, respectively; and a second gate driver is provided in the second peripheral area; and the m-th first driving signal line of the plurality of first driving signal lines and the k-th second driving signal line of the plurality of second driving signal lines are both electrically connected, in the second peripheral area, to an m-th output terminal of the second gate driver.

In some embodiments, the first driving signal line is a gate line, and the second driving signal line is an auxiliary line electrically connected in parallel with the gate line.

In some embodiments, a plurality of rows of sub-pixel units are provided in the display area; the gate lines and gate electrodes of transistors of the sub-pixel units are arranged in the same layer; and the auxiliary lines and anodes of the sub-pixel units are arranged in the same layer.

In some embodiments, the auxiliary line has a fold-line shape.

In some embodiments, the display panel further includes a base substrate; and wherein an orthographic projection of the auxiliary lines on the base substrate is not overlapped with an orthographic projection of the anodes of the sub-pixel units on the base substrate.

BRIEF DESCRIPTION OF THE DRAWINGS

The above and/or additional aspects and advantages of the present disclosure will become apparent and easily understood from the following description of the embodiments in conjunction with the accompanying drawings, in which.

DETAILED DESCRIPTION OF EMBODIMENTS

Figure 1:
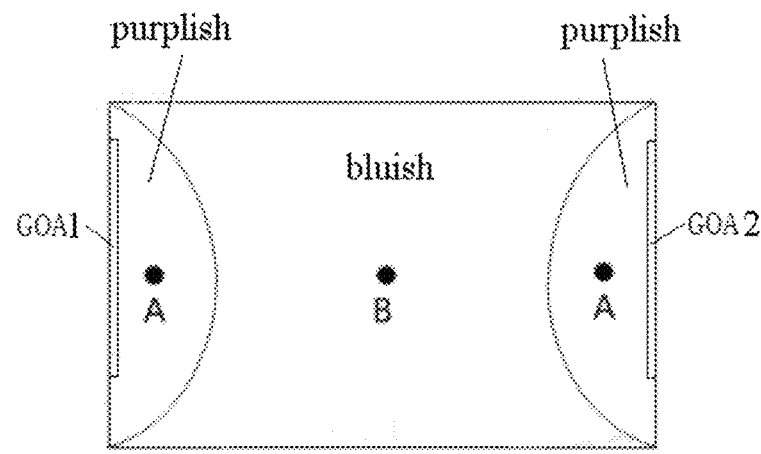
FIG. 1 is a schematic view showing a structure of a display panel in the prior art.

Hereinafter, embodiments of the present disclosure will be described in detail. Examples of the embodiments are shown in the accompanying drawings. The same or similar reference numerals represent the same or similar components or the components having the same or similar functions throughout. Further, if a detailed description of a well-known technique is unnecessary for the features of the present disclosure, it may be omitted. The embodiments described below with reference to the drawings are exemplary, and are only used to explain the present disclosure, but cannot be considered as limiting the present disclosure.

It will be understood by those skilled in the art that, unless otherwise defined, all terms (including technical and scientific terms) used herein have the same meaning as commonly understood by one of ordinary skill in the art to which this disclosure belongs. It should also be understood that terms such as those defined in the general dictionary should be understood to have meanings consistent with the meanings in the context of the prior art, and unless specifically defined like this, they would not be explained as idealized or overly formal meaning.

Those skilled in the art will understand that, unless specifically stated otherwise, the singular form represented by "a", "an" and "the" may include plural form. It should be further understood that the wording "include/comprise" used in the specification of the present disclosure refers to the presence of the described features, integers, steps, operations, elements and/or components, but does not exclude the presence or addition of one or more other features, integers, steps, operations, elements, components, and/or groups thereof. As used herein, the term "and/or" includes all or any of the elements and all combinations of one or more of the associated items listed.

The technical solution of the present disclosure and the way it solves the above technical problem will be described in detail as follows with referent to the specific embodiments.

The display panel includes the GOA (Gate driver On Array) and the display area. In the related art, each output terminal of the GOA is generally connected to, by one driving signal line, the pixel driving circuit of the sub-pixel unit in the display area. After making a close study on the display panel, the inventors of the present application have found that abnormal color may occur in the display area in some cases during operating of the display panel, which seriously degrades the display effect. A specific phenomenon relating to the abnormal color lies in that: the portion of the display area that is close to the GOA is biased to be purplish while the portion of the display area that is far away from the GOA is biased to be bluish.

When testing the current in the display area under normal display frequency (such as 60 Hz), it is found that in the portion of the display area that is close to the GOA there is relatively low current while in the portion of the display area that is far away from the GOA there is relatively high current. In this case, the portion of the display area that is close to the GOA is biased to be purplish while the portion of the display area that is far away from the GOA is biased to be bluish. When testing the current in the display area under reduced display frequency, the difference of the current value at various portions in the display area is small. In this case, the phenomenon of abnormal color in the display area is relieved.

As shown in FIG. 1, a display panel having two GOAs is taken as an example. In the display panel, two GOAs are respectively located on two sides of the display area. When testing the current in the display area under normal display frequency, it is found that in the portions of the display area that are close to the two sides of the display area there is relatively low current while in the portion of the display area that is close to the middle of the display area there is relatively high current. At this time, as shown in FIG. 1, the two side portions (portions A) of the display area are biased to be purplish while the middle portion (portion B) of the display area is biased to be bluish.

When testing the current in the display area under a reduced display frequency of 30 HZ, the difference of the electrical current value at various portions in the display area is small. In this case, the middle portion and the two side portions of the display area tend to have normal color, which means the phenomenon of abnormal color in the display area is relieved.

After analyzing the above test results, the inventor of the present application believe that the reason for the abnormal color present in the display panel during operation lies in that: the driving data line connected to the output terminal of the GOA has a large resistance, which causes a large resistance-capacitance delay (RC delay) and insufficient driving capability of the GOA. As a result, the rise time Tr and the fall time Tf is prolonged in the portions of the display area that are far away from the GOA and the charging time is insufficient, which causes the phenomenon of abnormal color.

It is further conceived by the inventors of the present application that the phenomenon of abnormal color can be effectively avoided if the resistance of the driving data line connected to the output terminal of the GOA is reduced.

Figure 2:
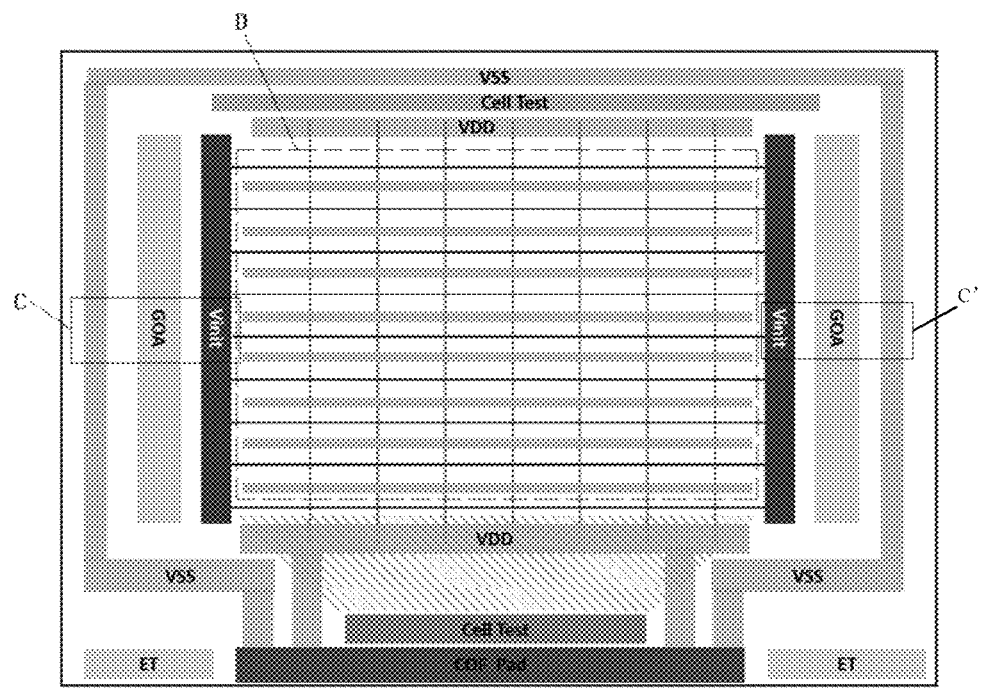
FIG. 2 is a schematic view showing a structure of a display panel according to an embodiment of the present disclosure.
Figure 3A:
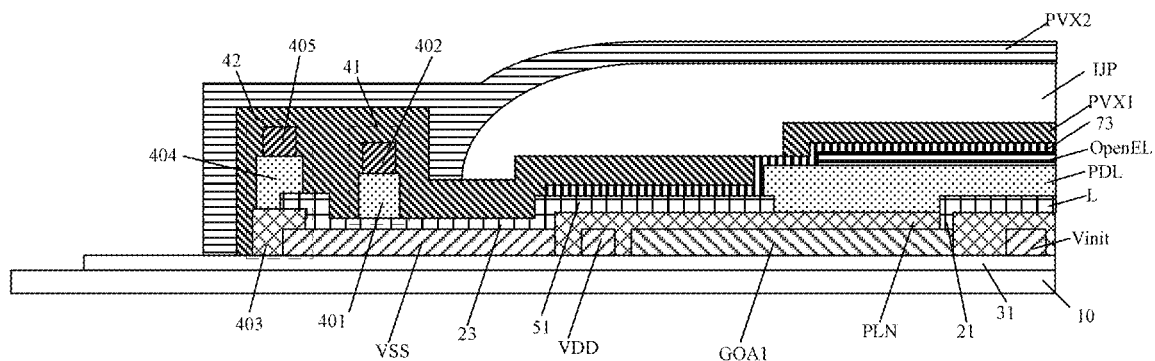
FIG. 3A is a cross sectional view of the display panel illustrated in FIG. 2 at the location C according to an embodiment of the present disclosure.
Figure 3B:
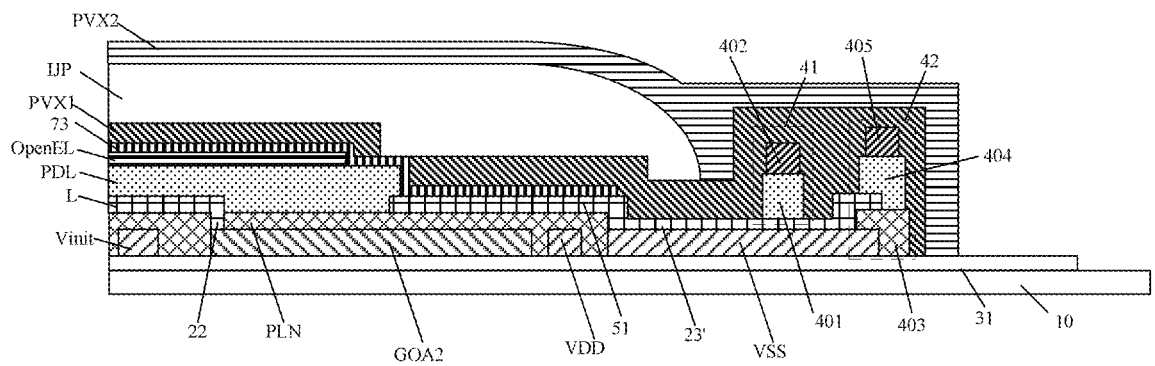
FIG. 3B is a cross sectional view of the display panel illustrated in FIG. 2 at the location C' according to an embodiment of the present disclosure.
Figure 4:
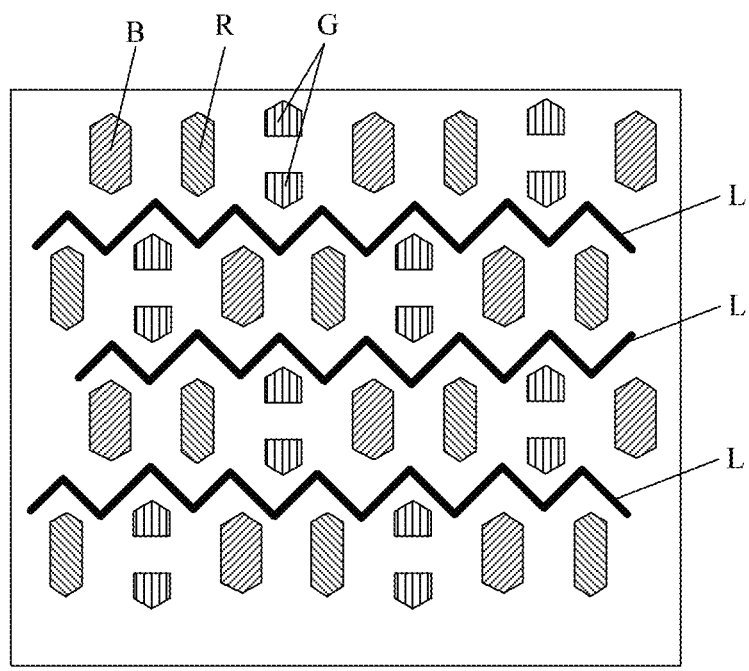
FIG. 4 is a partial enlarged view of a display panel provided by an embodiment of the present disclosure.

In order to facilitate the understanding of the structure of the display panel, the names of the components in FIGS. 2 to 4 are explained below:

GOA refers to a gate driver on array;
Open EL refers to an electron transport layer;
PDL refers to a pixel definition layer;
PVX refers to a passivation layer;
IJP refers to an ink jet print, which means a sealing layer (also called an encapsulation layer, such as an organic encapsulation layer) formed by inkjet printing;
PLN refers to a planarization layer;
PS refers to a photo spacer;
ET and Cell Test each represent screen test unit;
VDD refers to a first-level signal line, VSS refers to a second-level signal line, and Vinit refers to the initialization voltage signal line;
COF refers to chip on film; and
COF Pad refers to the pad in the display panel that has COF.

FIG. 2 to FIG. 4 show a structure of an OLED display panel. The display panel provided in the present disclosure may also be of other types or structural forms.

An embodiment of the present disclosure provides a display panel. As shown in FIG. 2 to FIG.4, the display panel includes a display area D and a peripheral area located around the display area D. The display area D is used to display an image. For example, the display area D may include sub-pixel units PL arranged in rows and columns. The direction in which rows of the sub-pixel units extend may be, for example, the horizontal direction in FIG. 2. The direction in which columns of the sub-pixel units extend may be, for example, the vertical direction in FIG. 2. The peripheral area is usually used for routing structures such as lines and is a non-display area. The peripheral area can be divided into multiple portions. For example, in the embodiment shown in FIG. 2, the display panel may have a first peripheral area P1. A first gate driver GOA1 is provided in the first peripheral area P1. The first gate driver GOA1 has a plurality of output terminals, which are electrically connected to a plurality of first driving signal lines (such as gate lines GL) provided on the display panel, for example, are electrically connected in one-to-one correspondence. As an example, the m-th first driving signal line of the first driving signal lines is electrically connected to the m-th output terminal of the first gate driver GOA1 (m is an integer greater than or equal to 1). In the embodiment of the present disclosure, each gate line GL corresponds to a row of sub-pixel units PL and is connected to the pixel driving circuit (such as a gate of a transistor) of each sub-pixel unit in this row of sub-pixel units so as to provide a required gate scan signal for each sub-pixel unit. In an embodiment of the present disclosure, the display panel further includes a plurality of second driving signal lines (for example, the auxiliary lines L). The second driving signal lines are arranged in a layer different from the layer where the first driving signal lines are located. Similar to the first driving signal line, the k-th second driving signal line of the plurality of second driving signal lines is also electrically connected to the m-th output terminal of the first gate driver GOA1 in the first peripheral area P1 (k is also an integer greater than or equal to 1, and k may be equal to m, or unequal to m). The display panel may include a base substrate 10 for carrying various film layer structures thereon, as shown in FIG. 3A and FIG. 3B.

It should be noted that quantity of the first driving signal lines (such as gate lines GL) may be equal to quantity of the second driving signal lines (such as auxiliary lines L), or may be different from quantity of the second driving signal lines (such as auxiliary lines L). For example, quantity of the second driving signal lines (such as auxiliary lines L) may be smaller than quantity of the first driving signal lines (such as gate lines GL).

In some embodiments, the display panel may further include a second peripheral area P2 located around the display area D. The first peripheral area P1 and the second peripheral area P2 are located at two opposite sides of the display area D. A second gate driver GOA2 is provided in the second peripheral area P2. The second gate driver GOA2 may be disposed in line with the first gate driver GOA1. Each gate line GL in the display panel may be configured to be electrically connected at one end to the output terminal of the first gate driver GOA1 and electrically connected at the other end to the corresponding output terminal of the second gate driver GOA2. In this way, the stability of the signal on the gate line may be improved, which is especially beneficial to a display with a large screen area.

In some embodiments, the m-th first driving signal line of the plurality of first driving signal lines (for example, gate lines) and the k-th second driving signal line of the plurality of second driving signal lines (for example, auxiliary lines L) are both electrically connected to the m-th output terminal of the second gate driver GOA2 in the second peripheral area P2. In this way, not only the m-th first driving signal line is connected from the m-th output terminal of the first gate driver GOA1 in the first peripheral area P1 to the m-th output terminal of the second gate driver GOA2 in the second peripheral area P2, but also the m-th second driving signal line is connected from the m-th output terminal of the first gate driver GOA1 in the first peripheral area P1 to the m-th output terminal of the second gate driver GOA2 in the second peripheral area P2. The second driving signal line and the first driving signal line are arranged in two different layers respectively. Thus, they form a parallel structure between the first gate driver GOA1 and the second gate driver GOA2, which can reduce the resistance of the driving signal line through which the gate line scanning signal is transmitted from the gate driver to the sub-pixel units. This is beneficial to reducing the resistance-capacitance delay. In this way, the driving capability of the GATE DRIVER may be improved, and the rise time Tr and the fall time Tf of the portions of the display area D that are far away from to the gate driver may be shortened. As a result, the charging time is increased, thereby effectively preventing the display area D from abnormal colors.

In some embodiments, it can be understood that, any one of the first driving signal lines and the second driving signal lines (as long as the condition that m is greater than or equal to 1 is met) meets the connection relationship between the m-th first/second driving signal line and the first/second gate driver GOA1/GOA2.

As an example, the first driving signal lines may be gate lines, and the second driving signal lines may be auxiliary lines electrically connected in parallel with the gate lines. In some embodiments, the gate line GL and the corresponding auxiliary line L may be connected only at the output terminals of the first gate driver GOA1 in the first peripheral area P1 and at the output terminals of the second gate driver GOA2 in the second peripheral area P2, instead of being connected in the display area, which can prevent excessive via holes from being formed in the display area. However, the embodiments of the present disclosure are not limited thereto. For example, the gate line GL and the corresponding auxiliary line L may also be connected through the via structure in the display area D.

Figure 5:
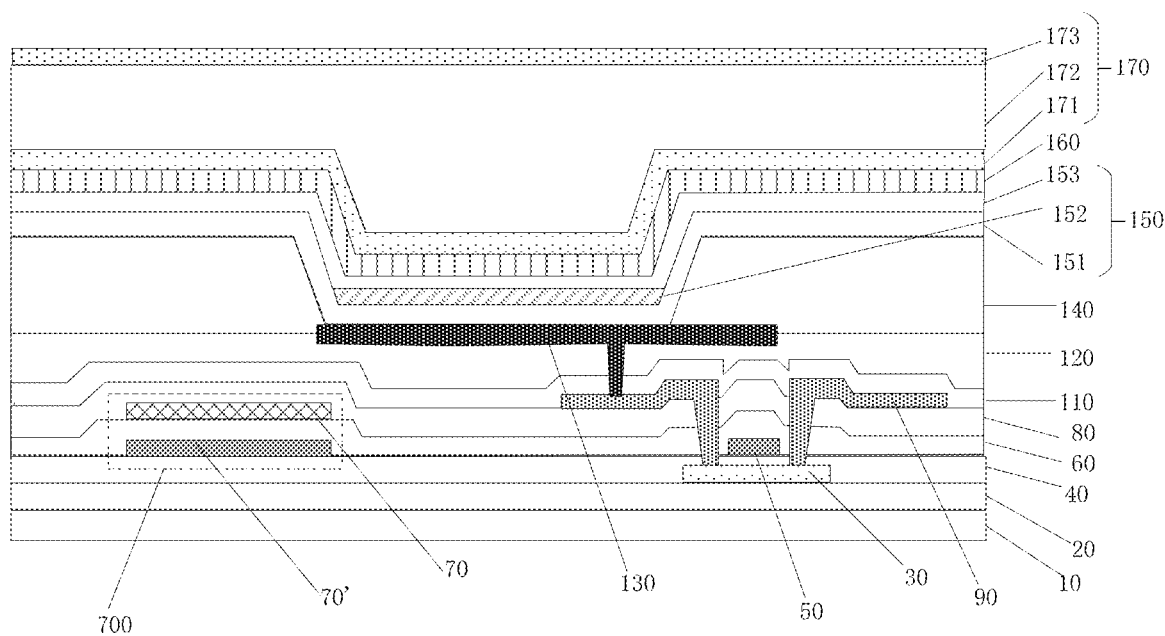
FIG. 5 schematically illustrates an example of a layer structure of a sub-pixel unit in a display area.

FIG. 5 schematically illustrates an example of a layer structure of a sub-pixel unit in the display area. As shown in FIG. 5, in some embodiments, the OLED display panel includes a base substrate 10 and a buffer layer 20, an active layer 30, a first gate insulating layer 40, and a first gate layer 50, a second gate insulating layer 60, a second gate layer 70, an interlayer dielectric layer 80, a source/drain electrode layer 90, a passivation layer 110, a planarization layer 120, an anode layer 130, a pixel definition layer 140, a light emitting functional layer 150, a cathode layer 160, and a encapsulation layer 170. Specifically, the base substrate 10 is, for example, a flexible PI (polyimide) substrate, which is made of a transparent material. The buffer layer 20 is made of a transparent insulating material, such as silicon oxide, silicon nitride, or the like, which covers the entire surface of the base substrate 10. The active layer 30 includes the active region in a thin film transistor of the pixel circuit, which can be made of a semiconductor material and has poor light transmission. The first gate insulating layer 40 is made of a transparent insulating material, such as silicon oxide, silicon nitride, or the like, which covers the entire surface of the base substrate 10. The first gate layer 50 is made of a metal material, and includes a reset signal line, a gate line, and a light emission control line in a pixel circuit and a gate in a thin film transistor. That is, the reset signal line, the gate line, and the light emission control line in the pixel circuit, and the gate in the thin film transistor can be arranged in the same layer, i.e., in the first gate layer 50, and can be formed using the same patterning process. The second gate insulating layer 60 is made of a transparent insulating material, such as silicon oxide, silicon nitride, or the like, which covers the entire surface of the base substrate 10. The second gate layer 70 includes an initialization signal line Vinit in the pixel circuit. As shown in FIG. 5, the second gate layer 70 may also form a storage capacitor 700 together with a portion 70' of the first gate layer that overlaps with the second gate layer 70.

The interlayer dielectric layer 80 is made of a transparent insulating material, such as silicon oxide, silicon nitride, or the like, which covers the entire surface of the base substrate 10. The source/drain electrode layer 90 is made of a metal material, and may include a data line and a power signal line (such as a high-voltage level signal line) in a pixel circuit, and source/drain electrodes in a thin film transistor. That is, the data line, the power signal line (such as high-voltage level signal lines), and the source/drain electrodes in the thin film transistor are disposed in the same layer, i.e., in the source/drain electrode layer 90, and can be formed using the same patterning process. The passivation layer 110 is made of a transparent insulating material, such as silicon oxide, silicon nitride, or the like, which covers the entire surface of the base substrate 10. The planarization layer 120 is made of a transparent organic material, such as silicon oxide, silicon nitride, or the like, which covers the entire surface of the base substrate 10. The anode layer 130 is made of a metal material, including an anode of an OLED source. The anode of the OLED source can be formed by a patterning process. The pixel definition layer 140 is supported by a transparent organic material and used to define the light emitting area of the OLED display panel, which may be formed by a patterning process. The light-emitting functional layer 150 includes a first particle transmitting layer 151, a light-emitting layer 152, and a second particle transmitting layer 153, which are disposed away from the base substrate 10 in this order. The first particle transmitting layer 151 includes, for example, a hole injection layer, a hole transport layer, and an electron blocking layer, etc. The second particle transmitting layer 153 includes, for example, an electron injection layer, an electron transport layer, and a hole blocking layer. Both the first particle transmitting layer 151 and the second particle transmitting layer 153 cover the entire surface of the base substrate and are made of a transparent material. The light-emitting layer 152 is only disposed in the light-emitting area defined by the pixel definition layer 140, and may be formed by vapor deposition using a FMM mask. The cathode layer 160 is made of a transparent conductive material, such as ITO, ZnO, and the like, and covers the entire surface of the base substrate 10. When a high voltage level (VDD) signal and a low voltage level (VSS) signal are applied to the anode layer 130 and the cathode layer 170 respectively, the light emitting layer 152 may emit light under the excitation of the voltage difference between them. The encapsulation layer 170 includes a first inorganic encapsulation layer 171, an organic encapsulation layer 172, and a second inorganic encapsulation layer 173, which are disposed away from the base substrate 10 in this order. The first inorganic encapsulation layer 171, the organic encapsulation layer 172, and the second inorganic encapsulation layer 173 are stacked and cover the entire surface of the base substrate 10. The encapsulation layer 170 is transparent.

Those skilled in the art should understand that FIG. 5 is only an example schematically showing the film layer structure of the sub-pixel unit in the display area, which mainly shows the layer structure constituting the OLED display panel and illustrates that the signal of the pixel circuit is transmitted to the OLED element through the thin film transistor to achieve the light emitting of the OLED element.

In some embodiments, the gate line GL and the gate of the thin film transistor in the sub-pixel unit are arranged in the same layer (formed from the same material and in the same patterning step), while the auxiliary line L and anodes in the sub-pixel units are arranged in the same layer. In the layout of the display panel, the anodes in each sub-pixel unit are often distributed in a discrete pattern, so that it is easier to make full use of the wiring space by arranging the auxiliary lines L in the layer where the anodes are located.

In some embodiments, as shown in FIG. 4, the auxiliary line L may have a fold-line shape. Since the auxiliary line L is arranged in the same layer as the anode in the sub-pixel unit, this shape of the auxiliary line L is advantageous to avoid the anode in the sub-pixel unit. In FIG. 4, the anodes in the sub-pixel units are schematically represented by each of the pentagons and hexagons in FIG. 4, and the anodes of the three different-colored sub-pixel units are respectively represented by B (blue), R (Red) and G (green), respectively. It can be seen from FIG. 4 that the auxiliary line L evades the anode structure of each sub-pixel unit. It should be noted that what is shown in FIG. 4 is only a schematic shape of the anode of the sub-pixel unit, and the embodiments of the present disclosure are not limited thereto. The anode of the sub-pixel unit may be designed into various shapes as required. For example, the orthographic projection of the auxiliary line L on the base substrate 10 and the orthographic projection of the anode in the sub-pixel unit on the base substrate 10 are not overlapped. This can prevent the auxiliary line L from being electrically connected to the anode in the sub-pixel unit.

In some embodiments, as shown in FIGS. 3A and 3B, the auxiliary line L (for example, the k-th auxiliary line L, where k is a positive integer greater than or equal to 1) is located on the side of the first gate driver GOA1 and the second gate driver GOA2 that is distal to the base substrate 10. A planarization layer PLN is provided on the side of the first gate driver GOA1 and the second gate driver GOA2 that is distal to the base substrate 10. In the first peripheral area P1, the k-th auxiliary line L is electrically connected to the corresponding output terminal of the first gate driver GOA1 (for example, the m-th output) by the first via hole 21 that penetrates through the planarization layer PLN. Similarly, in the second peripheral area P2, the auxiliary line L (for example, the k-th auxiliary line) is electrically connected to the corresponding output terminal of the second gate driver GOA2 (for example, the m-th output) by the second via hole 22 that penetrates through the planarization layer PLN.

FIG. 3A shows an example of the layer structure in the first peripheral area P1, and FIG. 3B shows an example of the layer structure in the second peripheral area P2 corresponding thereto. For convenience of explanation, the structures in FIGS. 3A and 3B are presented in a substantially symmetrical manner. However, embodiments of the present disclosure are not limited thereto. The layer structure in the first peripheral area P1 and the corresponding layer structure in the second peripheral area P2 do not need to be arranged symmetrically, and can be laid out according to the needs of the actual circuit layout.

It can be seen from FIG. 3A and FIG. 3B that either of the first peripheral area P1 and the second peripheral area P2 may further include: a pixel definition layer PDL, an electron transport layer OpenEL, a cathode layer 73, a first passivation layer PVX1, and an encapsulation layer IJP and second passivation layer PVX2. The pixel definition layer PDL is located on the side of the auxiliary line L distal to the base substrate 10. The electron transport layer OpenEL is located on the side of the pixel definition layer PDL distal to the base substrate 10. The cathode layer 73 is located on the side of the electron transport Layer OpenEL distal to the base substrate 10. The first passivation layer PVX1 is located on the side of the cathode layer 73 distal to the base substrate 10. The encapsulation layer IJP is located on the side of the first passivation layer PVX1 distal to the base substrate 10. The second passivation layer PVX2 is located on the side of the encapsulation layer IJP distal to the base substrate 10.

In some embodiments, a plurality of level signal lines may also be provided in the first peripheral area P1 and the second peripheral area P2, such as the first level signal lines VSS for transmitting low voltage level signal, and the second level signal lines VDD for transmitting high voltage level signal, the initialization signal line Vinit for transmitting the initialization voltage signal, and the like. As shown in FIG. 3A, in the first peripheral area P1, the first level signal line VSS is located on the side of the planarization layer PLN that faces towards the base substrate 10. The first level signal line VSS is further away from the display area D than the first gate driver GOA1. In the first peripheral area P1, a cathode connection layer 51 is further provided for transmitting the level signal from the first level signal line VSS to the cathode layer 73. The cathode connection layer 51 is located on the side of the planarization layer PLN distal to the base substrate 10. The cathode connection layer 51 is electrically connected to the cathode layer 73, and electrically connected to the first level signal line VSS by the third via hole 23 penetrating through the planarization layer PLN. The cathode connection layer 51 and the auxiliary line L may be arranged in the same layer. That is, they are made of the same material in the same patterning process step.

Similarly, as shown in FIG. 3B, the above-mentioned first level signal line VSS may also be provided in the second peripheral area P2. In the second peripheral area P2, the first level signal line VSS is located on the side of the planarization layer PLN that faces towards the base substrate 10. The first level signal line VSS is further away from the display area D than the second gate driver GOA2. In the second peripheral area P2, a cathode connection layer 51 may be further provided for transmitting the level signal from the first level signal line VSS to the cathode layer 73. The cathode connection layer 51 is located on the side of the planarization layer PLN distal to the base substrate 10. The cathode connection layer 51 is electrically connected to the cathode layer 73, and electrically connected to the first level signal line VSS by the third via hole 23' penetrating through the planarization layer PLN. In some embodiments, a first wall 41 and a second wall 42 may be further provided in the first peripheral area P1 and the second peripheral area P2. The second wall 42 is further away from the display area D than the first wall 41. The first wall 41 includes a first blocking layer 401 on the side of the cathode connection layer 51 distal to the base substrate 10 and a second blocking layer 402 on the side of the first blocking layer 401 distal to the base substrate 10. The second wall 42 includes a third blocking layer 403 located on the side of the first level signal line VSS distal to the base substrate 10, the fourth blocking layer 404 located on the side of the cathode connection layer 51 distal to the base substrate 10, and the fifth blocking layer 405 located on the side of the fourth blocking layer 404 distal to the substrate 10. The first blocking layer 401 and the fourth blocking layer 404 are arranged in the same layer and made of the same material as the pixel definition layer PDL. The third blocking layer 403 is arranged in the same layer and made of the same material as the planarization layer PLN. As an example, the second blocking layer 402 and the fifth blocking layer 405 may be arranged in the same layer and made of the same material, for example, may be arranged in the same layer as the photo spacer layer (PS) of the display panel.

In some embodiments, in addition to the gate lines GL, a plurality of reset lines RL are provided in the display area D.

Figure 6:
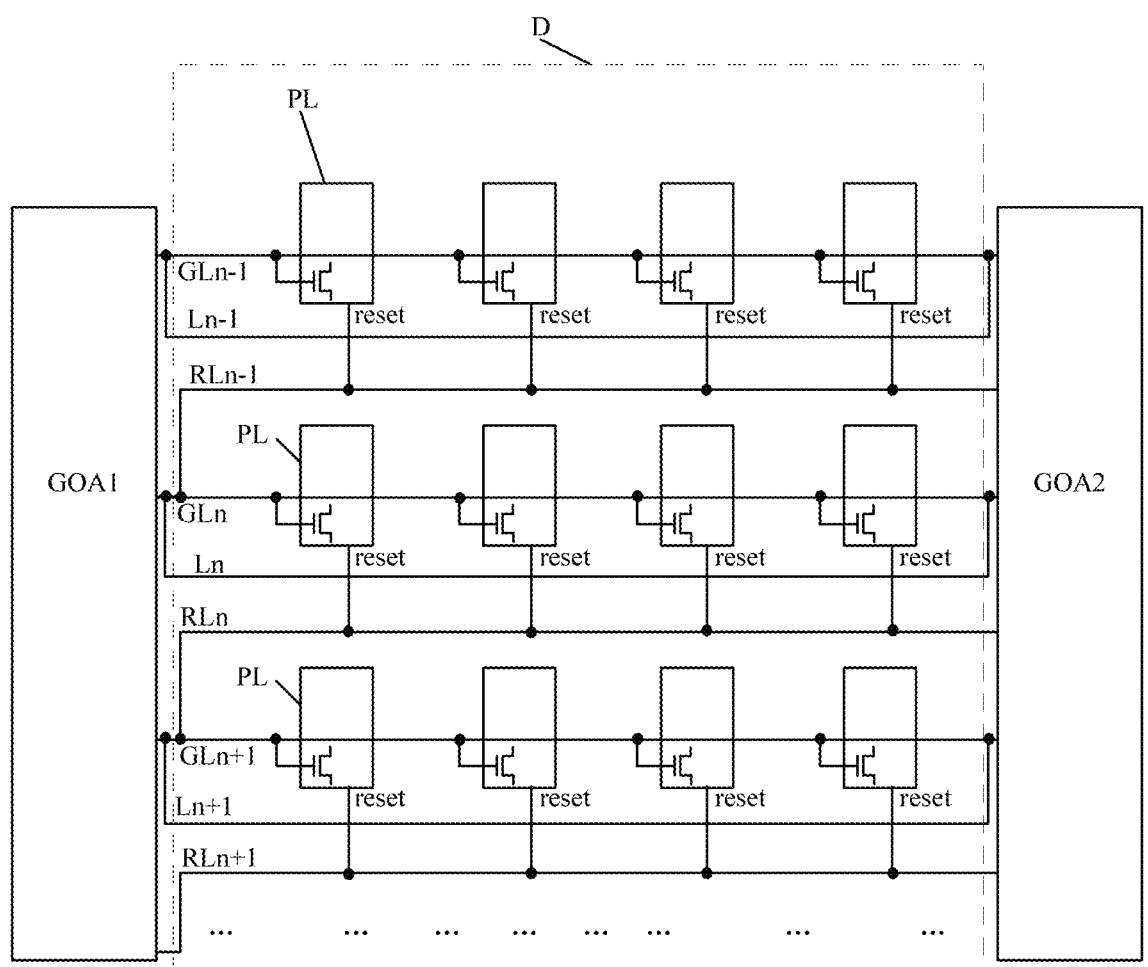
FIG. 6 schematically illustrates the connection between auxiliary lines, gate lines, reset lines, and sub-pixel units in the display area.

FIG. 6 schematically illustrates the connection between auxiliary lines L, gate lines GL, reset lines RL, and sub-pixel units PL in the display area D. As shown in FIG. 6, the n-th gate line GLn and the n-th reset line RLn correspond to the n-th row of the sub-pixel units, and is respectively connected to the respective sub-pixel units PL of the n-th row of the sub-pixel units. The reset line RL may be connected to a reset port of the corresponding sub-pixel unit PL, used to perform a reset operation on the sub-pixel unit. The n-th output terminal of the first gate driver GOA1 and the n-th output terminal of the second gate driver GOA2 are electrically connected to the n-th gate line GLn, and are both connected to the n−1-th reset line, where n is an integer greater than or equal to two. The n-th auxiliary line Ln only needs to be connected to the n-th output terminal of the first gate driver GOA1 and the n-th output terminal of the second gate driver GOA2, and does not need to be connected directly to the sub-pixel unit PL.

In some embodiments, it can be understood that, any one of the auxiliary lines L, the gate lines GL and the reset lines RL (as long as the condition that n is greater than or equal to 2) meets the connection relationship between the first/second gate driver GOA1/GOA2 and the n-th gate line, the n-th auxiliary line and the n−1-th reset line respectively.

In some embodiments, each output terminal of the gate drivers GOA1, GOA2 are electrically connected to the first portion of at least two types of driving signal lines (for example, the first driving signal line and the second driving signal line) located outside the display area D are both connected. The pixel driving circuit of each sub-pixel unit is electrically connected to the second portion of the at least two types of driving signal lines located in the display area D.

The second driving signal line (auxiliary line L) shown in FIG. 4 is one of the two types of driving signal lines, and other types of driving signal lines are not shown in the drawing. The pentagon and hexagon in FIG. 4 each represents the anode of one sub-pixel unit.

For example, among the at least two types of driving signal lines, one of the driving signal lines may be a driving signal line existing already in the display panel in the related art, and other type of driving signal lines is newly added driving signal line in an existing display panel.

Those skilled in the art can understand that the second portion of a driving data line is electrically connected to the pixel driving circuits of the sub-pixel units. After an output terminal of the gate driver is connected to the first portion of this driving data line, the state of the switching device (such as a thin film transistor) in a plurality of pixel driving circuits can be controlled by the driving data line.

In the display panel provided in the embodiment of the present disclosure, each output terminal of the gate driver is electrically connected to the pixel driving circuit of the corresponding sub-pixel unit through at least two types of driving signal lines. The at least two types of driving signal lines are connected in parallel between the output terminal and the pixel driving circuit. Compared with the technical solution that each output terminal of the gate driver in the display panel and the corresponding pixel driving circuit is connected by a single driving line, the resistance of at least two types of driving signal lines connected in parallel is lower. In the embodiment of the present disclosure, since the resistances of the at least two types of driving signal lines connected in parallel to the output terminal of the gate driver are low, the resistance-capacitance delay can be reduced and the driving capability of the gate driver may be improved, and the rise time Tr and the fall time Tf of the portions of the display area D that are far away from the gate driver may be shortened. As a result, the charging time is increased, thereby effectively preventing the display area D from abnormal colors.

It should be noted that, depending on the type of the display panel, the type of the output terminal of the gate driver and the specific position where the driving signal line is connected to the pixel driving circuit are different.

For OLED (Organic Light Emitting Diode) display panel, the switching device in the pixel driving circuit of the sub-pixel unit usually includes a driving transistor, a switching transistor and a reset transistor. The switching transistor and the reset transistor are connected to the driving data line.

For a liquid crystal display panel, the switching device in the pixel driving circuit of the sub-pixel unit may include a driving transistor only. The driving transistor is connected to the driving data line.

For example, in the display panel provided in the embodiment of the present disclosure, the display panel is an OLED display panel, and the output terminal of the gate driver includes a switching signal output terminal and a reset signal output terminal.

Each switching signal output terminal is electrically connected to the first portion of at least two types of driving signal lines. The gate of the switching transistor in the pixel driving circuit is electrically connected to the second portion of the at least two types of driving signal lines.

It should be noted that in the OLED display panel, the second portion of a driving signal line can be electrically connected to the pixel driving circuit of the sub-pixel unit. For the at least two types of driving signal lines electrically connected to the same switching signal output terminal, the second portions of the at least two types of driving signal lines are connected to the same pixel driving circuits. Each switching signal output terminal can simultaneously send a signal to the gate of the corresponding switching transistor through the at least two types of driving signal lines.

Each reset signal output terminal is electrically connected to the first portions of the at least two types of driving signal lines. The gate of the reset transistor in the pixel driving circuit is electrically connected to the second portions of the at least two types of driving signal lines.

It should be noted that in the OLED display panel, the second portion of a driving data line can be electrically connected to the pixel driving circuit of the sub-pixel unit. For the at least two types of driving signal lines electrically connected to the same reset signal output terminal, the second portion of the at least two types of driving signal lines are connected to the same pixel driving circuits. Each reset signal output terminal can simultaneously send a signal to the gate of the corresponding reset transistor through the at least two types of driving signal lines.

In some embodiments, in the display panel provided in the embodiment of the present disclosure, the display panel is a liquid crystal display panel, and the output terminal of the gate driver is a switching signal output terminal.

Each switching signal output terminal is electrically connected to the first portion of at least two types of driving signal lines. The gate of the driving transistor in the pixel driving circuit is electrically connected to the second portion of the at least two types of driving signal lines.

In some embodiments, the display panel provided in the embodiment of the present disclosure includes at least two gate drivers. Each gate driver corresponds to some of the at least two types of the driving signal lines and some of the sub-pixel units in the display area D.

In some embodiments, different gate drivers on different sides of the display area D may also be used to control the sub-pixel units located in different local regions in the display area D, rather than the technical solution as shown in FIG. 6 in which the sub-pixel units in the same row are controlled by both of the two gate drivers.

The output terminals of the gate driver and the sub-pixel units in the display area D can also be grouped in various ways. For example, the output terminals are in one-to-one correspondence to a plurality of rows of sub-pixel units, as shown in FIG. 4, in which each of the second type of driving signal lines L is connected to the pixel driving circuits of the corresponding row of sub-pixel units. Certainly, the output terminals of the gate driver and the sub-pixel units can be grouped in other ways. The details will be omitted here. Each output terminal of the gate driver is electrically connected, through at least two driving signal lines, to the pixel driving circuits of the sub-pixel units which fall into the same group as this output terminal.

As an example, in the display panel provided in the embodiment of the present disclosure, an input terminal of a driving signal line is electrically connected to one output terminal of the gate driver. The driving signal line has a plurality of output nodes. The plurality of output nodes are respectively electrically connected to the pixel driving circuits of the plurality of sub-pixel units.

The input terminal of the driving signal line is the end of the first portion of the driving signal line. The second portion of the driving signal line has a plurality of output nodes. The number of output nodes in the driving signal line is determined by quantity of sub-pixel units controlled by the output terminals of the gate driver. For example, one output terminal is intended to control one row of sub-pixel units including 100 sub-pixel units. Then, the driving signal line needs at least 100 output nodes.

As an example, in the display panel provided in the embodiment of the present disclosure, the at least two types of driving signal lines include a first driving signal line (such as a gate line GL) and a second driving signal line (such as an auxiliary line L).

For the OLED display panels, the first driving signal line is disposed in the same layer as the conductive layer of the gate of the gate driver, and the second driving signal line L is disposed in the same layer as the anode layer in the display panel.

As an example, since the auxiliary line L and anode layer in the display panel are arranged in the same layer, the preparation process of the auxiliary line L can be integrated into the preparation process of the anode layer. Since the anode layer itself is a part of the display panel, the newly added second type of driving signal line L does not need additional manufacturing process of the display panel. Therefore, the cost may be controlled to a large extent and high production efficiency may be ensured.

It should be noted that FIG. 3A shows the positional relationship of each component at the position C as shown in FIG. 2, and FIG. 3B shows the positional relationship of each component at the position C' as shown in FIG. 2.

Optionally, in the display panel provided in the embodiment of the present disclosure, the area where the gate driver is located further includes a base substrate 10 and a planarization layer PLN. The gate driver is disposed on the base substrate, and part of the planarization layer is disposed on a side of the gate driver distal to the base substrate.

One end of the auxiliary line L penetrates through the planarization layer and is electrically connected to the output terminal of the gate driver. The other part of the auxiliary line L is located on the side of the planarization layer distal to the gate driver.

Specifically, in the right side of FIG. 3A, the base substrate, the gate driver, and the planarization layer are stacked from bottom to top in sequence. The part of the planarization layer beyond the gate driver extends down to be in contact with the base substrate so as to seal the gate driver therein. The input terminal of the auxiliary line L, penetrating through the planarization layer in the thickness direction of the planarization layer, is electrically connected to the output terminal of the gate driver. The other part of the auxiliary line L is located on the side of the planarization layer distal to the gate driver.

Specifically, in FIGS. 3A and 3B, the cathode connection layer 51 and the pixel definition layer are both located above the planarization layer and are adjacent in the direction parallel to the base substrate. The pixel definition layer, the electron transport layer, and the cathode layer are sequentially stacked from bottom to top. The part of the cathode layer beyond the pixel definition layer is in contact with the anode layer.

For example, in the display panel provided in the embodiments of the present disclosure, the area where the gate driver is located further includes a first level signal line (VSS), a second level signal line (VDD) and an initialization voltage signal line (Vinit).

In some embodiments, the initialization voltage signal line is located at the side of the gate driver close to the display area D, the first level signal line is located at the side of the gate driver distal to the display area D, and the second level signal line is located at the side of the first level signal line distal to the gate driver.

In some embodiments, the planarization layer is in contact with the gate driver, the initialization voltage signal line, and the second level signal line. Any adjacent two of the gate driver, the first level signal line, the second level signal line, and the initialization voltage signal line on the base substrate are separated by the planarization layer.

Specifically, in FIG. 3A, the first level signal line, the second level signal line, the gate driver, and the initialization voltage signal line are arranged in sequence from left to right in the direction parallel to the base substrate. The body part of the planarization layer is disposed above the second level signal line, the gate driver and the initialization voltage signal line. Another part of the planarization layer is disposed between the second level signal line and the first level signal line, between the second level and the gate driver, and between the gate driver and the initialization voltage signal line.

For example, in FIG. 3A, the part of the cathode connection layer 51 beyond the planarization layer is in contact with the first level signal line.

As an example, the display panel provided in the embodiment of the application further includes a first passivation layer PVX1, an encapsulation layer IJP, and a second passivation layer PVX2. In FIG. 3A, the first passivation layer PVX1, the encapsulation layer IJP, and the second passivation layer PVX2 are sequentially stacked from bottom to top. The first passivation layer PVX1 is in contact with a part of the cathode layer 73 and the cathode connection layer 51.

The embodiments of the present disclosure also provide an electronic apparatus including the display panel described in any of the foregoing embodiments. In the embodiment of the present disclosure, the electronic apparatus may include any electronic apparatus having a display function, such as mobile phones, notebook computers, tablet computers, televisions, navigators, digital photo frames, and the like.

By applying the embodiments of the present disclosure, at least the following beneficial effects can be achieved:

In the display panel provided in the embodiment of the present disclosure, each output terminal of the gate driver is electrically connected to the pixel driving circuit of the corresponding sub-pixel unit through at least two types of driving signal lines. The at least two types of driving signal lines are connected in parallel between the output terminal and the pixel driving circuit. Compared with the technical solution that each output terminal of the gate driver in the display panel in the related art and the corresponding pixel driving circuit is connected by a single driving line, the resistance of at least two types of driving signal lines connected in parallel is lower. In the embodiment of the present disclosure, since the resistances of the at least two types of driving signal lines connected in parallel to the output terminal of the gate driver are low, the resistance-capacitance delay can be reduced and the driving capability of the gate driver may be improved, and the rise time Tr and the fall time Tf of the portions of the display area that are far away from to the gate driver may be shortened. As a result, the charging time is increased, thereby effectively preventing the display area from abnormal colors.

In the display panel provided in the embodiments of the present disclosure, since the second driving signal line (for example, the auxiliary line L) and anode layer in the display panel are arranged in the same layer, the preparation process of the second driving signal line can be integrated into the preparation process of the anode layer. Since the anode layer itself is a part of the display panel, the newly added second type of driving signal line does not need additional manufacturing process of the display panel. Therefore, the cost may be controlled to a large extent and high production efficiency may be ensured.

In the description of this application, it should be understood that the orientations or positional relationships indicated by the terms "center", "upper", "lower", "front", "back", "left", "right", "vertical", "horizontal", "top", "bottom", "inside", "outside", etc. are based on the orientations or positional relationships shown in the drawings. These terms are used to describe the present disclosure and simplify the description only, but not intended to indicate or imply the device or element referred to must have certain orientation or be operated in certain orientation, and thus cannot be considered as a limitation to the present disclosure.

The terms "first" and "second" are used for descriptive purposes only and are not to be considered as indicating or implying a relative importance or implicitly indicating the number of the referred technical features. Thus, features defined by "first" and "second" may include one or more of the features either explicitly or implicitly. In the description of the present disclosure, unless otherwise stated, "a plurality" means two or more than two.

In the description of this application, it should be noted that the terms "installation", "connection" and "connected" should be understood in a broad sense unless explicitly stated and limited otherwise. For example, they may be fixed connections, removable connections, integral connections. They can be connected directly, or connected indirectly through an intermediate medium, or can be the internal communication of two elements. For those of ordinary skill in the art, the specific meanings of the above terms in the present disclosure may be understood on a case-by-case basis.

In the description of this specification, the specific feature, structure, material or characteristics described may be combined in a suitable manner in any one or more embodiments or examples.

The above description is only part of the embodiments of the present disclosure. It is noted that, those skilled in the art could make improvements and modifications, which should be considered falling into the scope of the present disclosure, without departing from the principle in the present disclosure.

What is claimed is:

1. A display panel, comprising:
a display area; and
a first peripheral area located around the display area, a first gate driver being provided in the first peripheral area;
wherein the display panel is further provided with a plurality of first driving signal lines and a plurality of second driving signal lines;
wherein the plurality of first driving signal lines are arranged in a different layer from a layer in which the plurality of second driving signal lines are located; and
wherein an m-th first driving signal line of the plurality of first driving signal lines and a k-th second driving signal line of the plurality of second driving signal lines are both electrically connected, in the first peripheral area, to an m-th output terminal of the first gate driver, where m is an integer greater than or equal to 1 and k is also an integer greater than or equal to 1;
wherein the display panel further comprises a second peripheral area located around the display area; the first peripheral area and the second peripheral area are located at two opposite sides of the display area, respectively; and a second gate driver is provided in the second peripheral area; and the m-th first driving signal line of the plurality of first driving signal lines and the k-th second driving signal line of the plurality of second driving signal lines are both electrically connected, in the second peripheral area, to an m-th output terminal of the second gate driver; and
wherein the first driving signal line is a gate line, the second driving signal line is an auxiliary line, and a direction along which the first driving signal line extends is substantially parallel to a direction along which the second driving signal line extends.

2. The display panel according to claim 1, wherein the display panel further comprises a base substrate, and an orthographic projection of the first driving signal line on the display panel at least partially overlaps with an orthographic projection of the second driving signal line on the display panel.

3. The display panel according to claim 1, wherein a plurality of rows of sub-pixels are provided in the display area, and the gate lines and gate electrodes of transistors in the sub-pixel units are arranged in the same layer.

4. The display panel according to claim 1, wherein the m-th first driving signal line is an m-th gate line that is electrically connected to the gate electrodes of the transistors in the m-th row of sub-pixel units.

5. The display panel according to claim 1, wherein:
the display panel further comprises a base substrate, each of the first gate driver and the second gate driver comprises a semiconductor layer, and the k-th second driving signal line is a k-th auxiliary line that is located on a side of the semiconductor layer away from the base substrate; and a planarization layer is provided on the side of the first gate driver and the second gate driver distal to the base substrate.

6. The display panel according to claim 5, wherein the k-th auxiliary line is electrically connected to the m-th output terminal of the second gate driver through a second via hole.

7. The display panel according to claim 6, wherein the second via hole is located in the peripheral area.

8. The display panel according to claim 7, wherein the second via hole is located between the first gate driver and the display area, or the second via hole is located between the second gate driver and the display area.

9. The display panel according to claim 6, wherein the display area further comprises:
- a pixel definition layer on a side of the auxiliary lines distal to the base substrate;
- an electron transport layer on a side of the pixel definition layer distal to the base substrate;
- a cathode layer on a side of the electron transport layer distal to the base substrate;
- a first passivation layer on a side of the cathode layer distal to the base substrate;
- an encapsulation layer on a side of the first passivation layer distal to the base substrate; and
- a second passivation layer on a side of the encapsulation layer distal to the base substrate.

10. The display panel according to claim 9, wherein the first peripheral area further comprises:
- a first level signal line, the first level signal line being further away from the display area than the first gate driver; and
- a cathode connection layer on a side of the planarization layer distal to the base substrate,
- wherein the cathode connection layer is electrically connected to the cathode layer and electrically connected to the first level signal line by an opening penetrating through the planarization layer.

11. The display panel according to claim 9, wherein the second peripheral area further comprises:
- a first level signal line, the first level signal line being further away from the display area than the second gate driver; and
- a cathode connection layer on a side of the planarization layer distal to the base substrate,
- wherein the cathode connection layer is electrically connected to the cathode layer and electrically connected to the first level signal line by an opening penetrating the planarization layer.

12. The display panel according to claim 1, wherein:
a plurality of reset lines are further provided in the display area; and
an n-th output terminal of the first gate driver and an n-th output terminal of the second gate driver are both electrically connected to another reset line, where n is an integer greater than or equal to 2.

13. The display panel according to claim 10, wherein each of the first peripheral area and the second peripheral area further comprises:
- a first wall and a second wall which is farther from the display area than the first wall,
- wherein the first wall comprises a first blocking layer on a side of the cathode connection layer distal to the base substrate and a second blocking layer on a side of the first blocking layer distal to the base substrate; the second wall comprises a third blocking layer on a side of the first level signal line distal to the base substrate, a fourth blocking layer on a side of the cathode connection layer distal to the base substrate, and a fifth blocking layer on a side of the fourth blocking layer distal to the base substrate; the first blocking layer and the fourth blocking layer are arranged in the same layer and made of the same material as the pixel definition layer; and the third blocking layer is arranged in the same layer and made of the same material as the planarization layer.

14. An electronic apparatus, comprising the display panel according to claim 1.

15. The electronic apparatus according to claim 14, wherein the auxiliary lines extend in a lateral direction, and the auxiliary lines have at least a protrusion in a longitudinal direction.

16. The electronic apparatus according to claim 14, wherein the auxiliary lines have a fold-line shape.

* * * * *